United States Patent [19]
Gould

[11] Patent Number: 5,451,544
[45] Date of Patent: Sep. 19, 1995

[54] METHOD OF MANUFACTURING A BACK CONTACT FOR SEMICONDUCTOR DIE

[75] Inventor: Herbert J. Gould, Sherman Oaks, Calif.

[73] Assignee: International Rectifier Corporation, El Segundo, Calif.

[21] Appl. No.: 137,586

[22] Filed: Oct. 15, 1993

[51] Int. Cl.6 .......................................... H01L 21/441
[52] U.S. Cl. ................................... 437/197; 437/247; 148/DIG. 20
[58] Field of Search ............... 437/194, 196, 197, 202, 437/247; 148/DIG. 20, DIG. 126, DIG. 158

[56] References Cited
U.S. PATENT DOCUMENTS 4,965,173 10/1990 Gould .................................. 437/196
5,010,040 4/1991 Vayman .............................. 437/194

OTHER PUBLICATIONS

Wolf, "Silicon Processing for the VLSI Era, vol. 2: Process Integration", 1990, pp. 110–111.

Primary Examiner—Chandra Chaudhari
Attorney, Agent, or Firm—Ostrolenk, Faber, Gerb & Soffen

[57] ABSTRACT

The back contact of a silicon die consists of a pure aluminum contact, alloyed into the back surface of the silicon. The back surface need not be subjected to a grinding operation. The aluminum is deposited by an E-beam deposition process. The aluminum is alloyed into the silicon at a temperature lower than the melting point of pure aluminum, but higher than the melting point of a silicon-aluminum eutectic. Aluminum, nickel and silver are thereafter E-beam deposited, in sequence, on the aluminum surface and are sintered.

19 Claims, 2 Drawing Sheets

E-BEAM DEPOSITION OF PURE ALUMINUM.

E-BEAM DEPOSITION OF ALUMINUM, NICKEL, SILVER

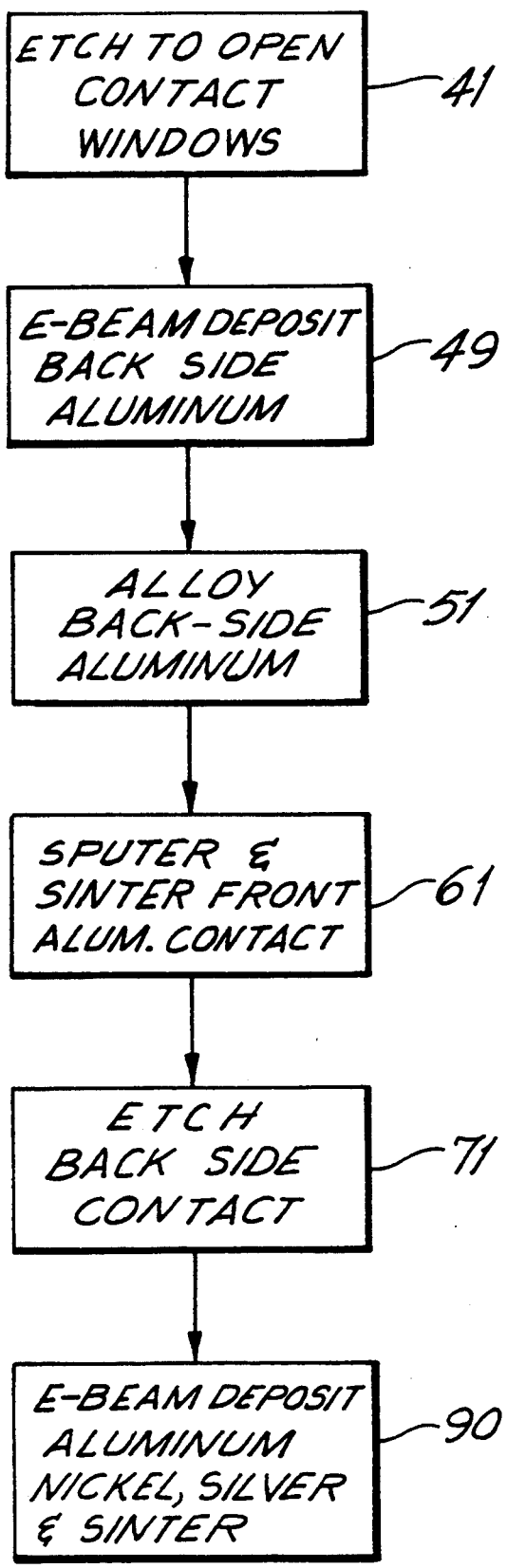

METHOD OF MANUFACTURING A BACK CONTACT FOR SEMICONDUCTOR DIE

BACKGROUND OF THE INVENTION

This invention relates to a structure for and process of manufacture of a semiconductor device, in particular, a power MOSFET or IGBT, and more particularly relates to a novel back electrode for the back or bottom electrode of such devices.

Power MOSgated products such as power MOSFETs, IGBTs and power integrated circuits in which intelligence circuits are integrated into such devices are well known. In the process of manufacture of such devices, the back or bottom surface of the wafer, from which die are subsequently cut, is commonly ground by a grinding tool before the back contact, usually a three-metal layer of Cr Ni Ag or Ti Ni Ag is applied thereto. While this grinding operation improves metal adherence to the back surface, the grinding operation frequently causes wafer breakage. Wafer breakage at this point in the processing is particularly expensive because almost the total cost of processing has already been invested in the wafer.

Prior art back metals commonly employ chromium and titanium as the first metal, primarily for their ability to form a coherent silicon dioxide/chromium oxide or silicon dioxide/titanium dioxide bond. This first metal is commonly described as the glue layer, as its function is to adhere the silicon to the nickel, which is the second metal of the trimetal. Conduction takes place via tunneling as the oxides are extremely thin. Generally, P type silicon presents a greater problem in establishing an ohmic contact than N type and the higher the resistivity of the P or N type silicon, the worse the problem becomes.

BRIEF DESCRIPTION OF THE INVENTION

In accordance with the present invention, it has been found that the conventional back-side grinding operation can be replaced by a pure aluminum contact which is preferably E-beam deposited on a clean back-side silicon surface and then alloyed into the silicon at a temperature, for example, of 600° C., which is higher than the melting point of the silicon aluminum eutectic (577° C.) but lower than the melting point of pure aluminum (660° C.). Any temperature between 577° C. and 660° C. can be used.

Pure aluminum has not been used as a contact because of its tendency to spike into the substrate. This is unacceptable where shallow junctions are involved. However, on the back side of the wafer, the aluminum can and should go as deep and with as much surface area as possible. Sputtering is an alternative method of deposition, and can deposit the aluminum/silicon alloy which is conventionally employed for front side metallization. E-beam systems, however, are best for depositing pure elements as they tend to behave somewhat like a vacuum distillation apparatus. High vapor pressure fraction will be interrupted by the shutter of the apparatus, the center cut will be deposited in pure form, and the low vapor pressure fraction will remain in the crucible.

Such an aluminum back contact is particularly useful on P type silicon and, for example, can reduce the forward voltage drop of an IGBT by 50 to 100 millivolts. Moreover, the aluminum contact will adhere well to the silicon and will not lift off the silicon even though unground, and forms an excellent contact to even high resistivity P type silicon. The novel contact can also be used with N type silicon which is highly doped.

Following the formation of the aluminum contact, the surface is prepared for solderable metallization by removing any thin aluminum oxide layer which may be present. An aluminum layer, a nickel layer and then a silver layer are next deposited by E-beam deposition and are sintered to form a diffusion bond between the aluminum layer and the eutectic. The use of an aluminum-nickel-silver trimetal can be used on any device and produces a particularly favorable back contact to P type substrates, whether or not ground before the E-beam deposition of the aluminum.

Other features and advantages of the present invention will become apparent from the following description of the invention which refers to the accompanying drawings.

BRIEF DESCRIPTION OF THE DRAWINGS

FIG. 3 is a flow diagram of the steps used in the manufacturing process of this invention.

DETAILED DESCRIPTION OF THE INVENTION

Figure 1:
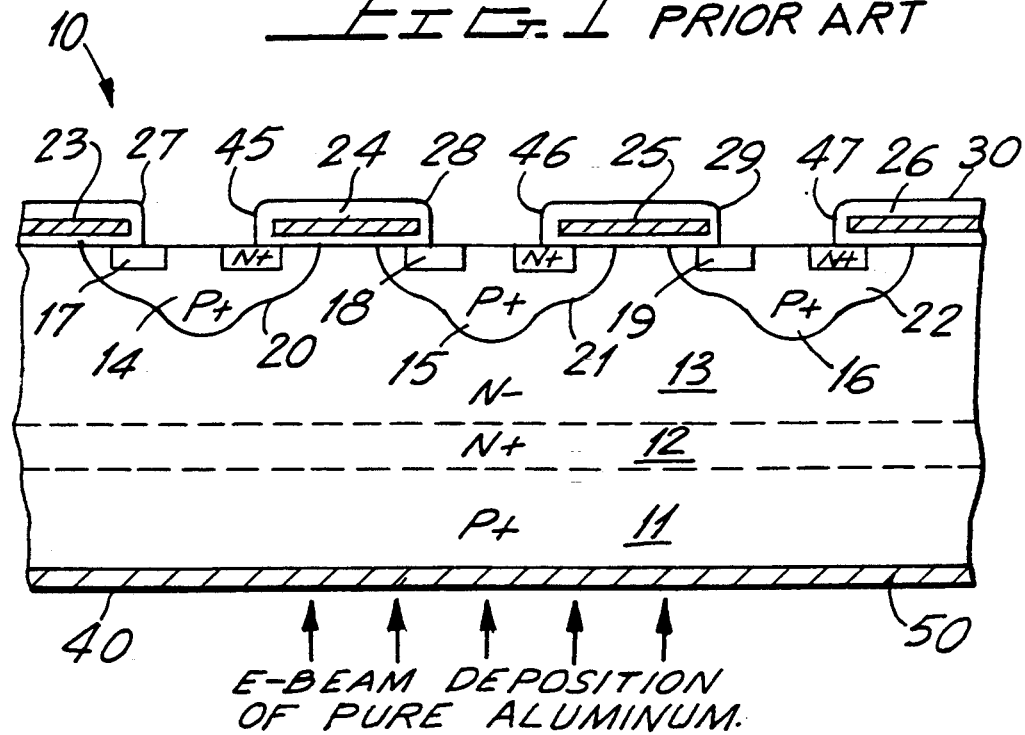
FIG. 1 is a cross-sectional view of a portion of a typical IGBT wafer after the E-beam deposition of aluminum on its back surface.

Referring first to FIG. 1, there is schematically shown, in exaggerated dimensions, a small portion of an IGBT wafer which can employ the process of the present invention. The terms "wafer" and "die" are sometimes interchangeably used herein, it being noted that many die are conventionally processed in a common wafer, and are separated upon the completion of the manufacturing process. The invention could also have been demonstrated in connection with a power MOSFET, a power IGBT, a MOSgated thyristor, or even a diode, all of which are termed "semiconductor die" or "wafers".

The IGBT of FIG. 1 may be made according to the detailed process set forth in copending application Ser. No. 08/041,136, now abandoned, filed Mar. 30, 1993, and the wafer is a thin, flat wafer 10 having a P+ body 11, an N+ layer 12 and an epitaxial N(−) layer 13 which receives the various junctions which define the device. Thus, FIG. 1 shows a plurality of cellular P+ bases 14, 15 and 16 which may be rectangular or hexagonal in topology and symmetrically distributed over the upper surface of the die or wafer.

The P+ bases 14, 15 and 16 are surrounded by shallower P(−) regions 20, 21 and 22, respectively. A plurality of respective N+ annular sources 17, 18 and 19 are contained within regions 20, 21 and 22, respectively, and define respective annular, invertible channels within the bases 14, 15 and 16.

The channel regions are covered by a conventional gate insulation layer, which is covered, in turn, by polysilicon gate segments 23, 24, 25 and 26. These gate segments of an insulation layer are covered by insulation segments (which may be silicon dioxide) 27, 28, 29 and 30, respectively.

At this stage of the manufacture of the device, which may have been carried out in any desired manner and in accordance with the invention, a pure aluminum contact 40 is E-beam evaporated on the bottom of the P+ silicon layer 11, as shown also in step 41 of FIG. 3. It is to be specifically noted that the substrate on which the pure aluminum 40 is deposited could have the N type conductivity, and could have any concentration level.

The back side silicon surface is first cleaned, as by etching, before the pure aluminum is E-beam deposited. This cleaning step can be a part of another process step, wherein contact windows have been opened in FIG. 1, as by etching openings 45, 46 and 47 in the masked front surface, prior to forming an aluminum top electrode.

Pure aluminum layer 50 is then E-beam evaporated, as shown in step 49 of FIG. 3, onto the clean back side of wafer 10, to a thickness of about 1000 Å. The exact deposition process used and aluminum thickness is not critical.

The wafers having the pure aluminum thereon are then placed in an alloying furnace and heated to a temperature greater than the melting point of an aluminum-silicon eutectic (577° C.), but lower than that of pure aluminum (660° C.). Pure silicon has a melting point of 1430° C. Thus, by heating at 600° C., which is above the eutectic melting point, but lower than the melting point of either of the two pure constituents, formation of the described alloy is guaranteed. In one test of the invention, a temperature of 600° C. worked satisfactorily. This operation takes place in a forming gas of 85% nitrogen and 15% hydrogen at 600° C. for about 30 minutes as shown at step 51 in FIG. 3.

Figure 2:
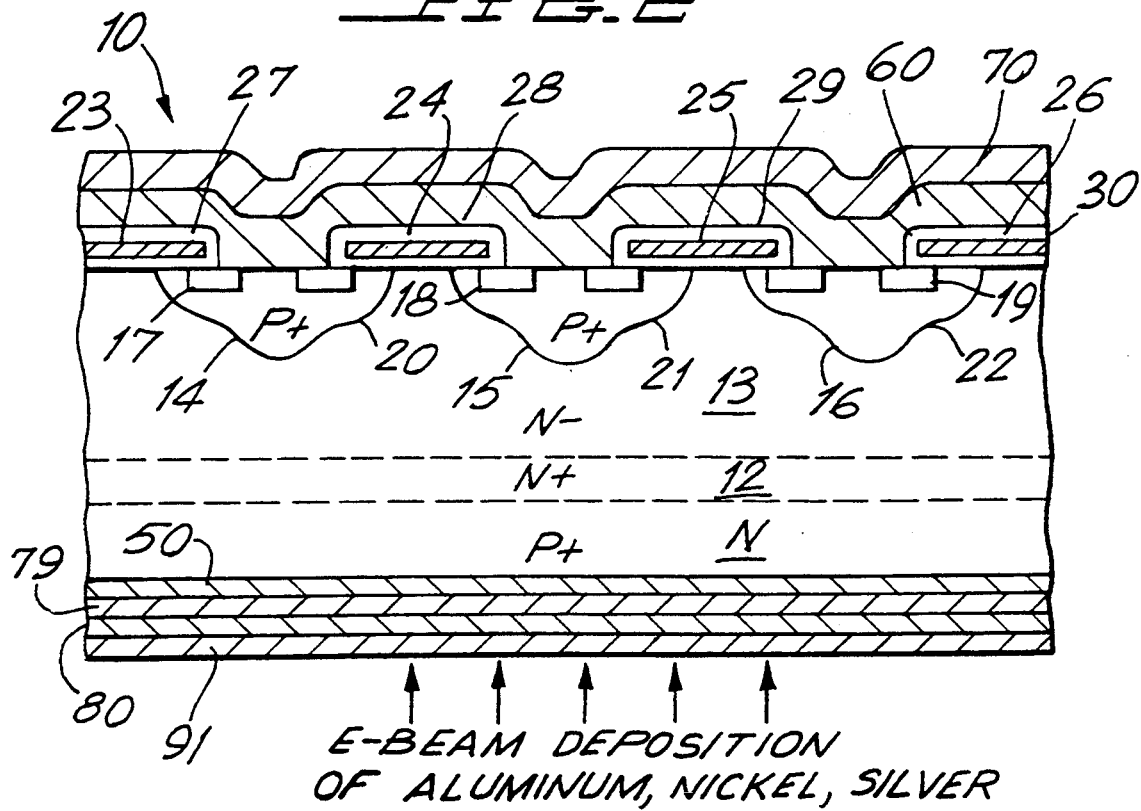
FIG. 2 is a cross-section of a preferred embodiment of the present invention following the E-beam deposition of aluminum nickel and then silver.

Thereafter, an aluminum front contact 60 is sputtered onto the front surface of the wafer, as shown in FIG. 2, and at step 61 in FIG. 3 and the aluminum contact 60 is sintered into the front surface. The sintered front aluminum contact is then covered with a photoresist and is etched to define conventional contact pads (not shown). Unexpectedly, these operations do not affect the alloyed back contact 50 because the etch used for the sintered aluminum contact 60 will not etch the alloyed aluminum contact 50 because too much silicon is present in the alloy.

Conventional process steps then are carried out, for example, a layer of amorphous silicon 70 (FIG. 2) is deposited atop the aluminum 60, and is coated with a photopolyimide (not shown). The photopolyimide is then patterned and the underlying amorphous silicon is etched in a freon plasma etch operation. This front side plasma etch (step 71 in FIG. 3) will also etch and clean the free surface of aluminum layer 50. Unexpectedly, the silicon plasma etch does not affect back contact 50 because too much aluminum is present in the alloy.

The alloy surface is then prepared to receive a solderable metallization by a dilute HF etch (1 part HF to 100 parts deionized water for 30 seconds), followed by a rinse and spin dry. This removes the thin aluminum oxide layer which is otherwise present.

Thereafter, a layer of aluminum 79 is E-beam deposited on the free, clean surface of aluminum alloy 50. Aluminum layer 79 has a thickness of about 1000 Å and could have been deposited by sputtering. A layer 80 of nickel is then E-beam evaporated on the free, clean surface of aluminum layer 50. About 3000 Å of nickel is used, although this is not critical. However, more than 4000 Å of nickel will introduce high stress in the contact layer. The nickel layer may also be deposited by sputtering.

Thereafter, a layer of silver 91 (FIG. 2) is deposited to a non-critical thickness, for example 6000 Å, by any desired process.

Thereafter, the aluminum, nickel and silver are sintered at a temperature of about 500° C. for about 30 minutes, in a forming gas as shown at step 90 in FIG. 3. It is preferred to sinter immediately to keep an oxide interface from building between the silicon and aluminum. This sinter operation sinters aluminum layer 79 to alloy 50 and creates a diffusion bond between all metal layers.

It should be noted that the aluminum-nickel-silver trimetal has particularly useful application to P type substrates, and may be used with substrate surfaces prepared in any way, as by grinding. The three layers can also all be formed by E-beam evaporation in an uninterrupted or unbroken sequence.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. The process of forming a back metal electrode on the back surface of a silicon wafer; said process comprising the steps of depositing a layer of pure aluminum on said surface of said silicon wafer, and thereafter alloying said pure aluminum layer and said silicon wafer at a temperature between the melting point of pure aluminum and the melting point of the silicon-/aluminum eutectic and wherein an aluminum contact is sputtered onto the top surface of said wafer and is sintered therein and has a pattern etched therein after said pure aluminum layer is alloyed to said back surface and then sequentially depositing a second layer of aluminum, a layer of nickel and a layer of silver atop the alloyed pure aluminum layer.

2. The process of claim 1 in which said alloying operation takes place in a forming gas.

3. The process of claim 1 wherein said layer of pure aluminum has a thickness of about 1000 Å.

4. The process of claim 1 wherein said back surface of said silicon wafer is of the P type conductivity.

5. The process of claim 1, wherein said second layer of aluminum, said layer of nickel and said layer of silver are sintered.

6. The process of claim 1 wherein said nickel is formed by the process of E-beam evaporation.

7. The process of claim 1 wherein said layer of nickel has a thickness of about 3000 Å.

8. The process of claim 5 wherein said layer of pure aluminum has a thickness of about 1000 Å.

9. The process of claim 6 wherein said layer of pure aluminum has a thickness of about 1000 Å.

10. The process of claim 7 wherein said layer of pure aluminum has a thickness of about 1000 Å.

11. The process of claim 8 wherein said back surface of said silicon wafer is of the P type conductivity.

12. The process of claim 9 wherein said back surface of said silicon wafer is of the P type conductivity.

13. The process of claim 10 wherein said back surface of said silicon wafer is of the P type conductivity.

14. The process of forming a trimetal electrode on the back surface of a silicon wafer, comprising the steps of depositing a first layer of pure aluminum on said back surface of said silicon wafer, and thereafter alloying together said first layer of pure aluminum and said silicon wafer at a temperature between the melting point of pure aluminum and the melting point of the silicon-/aluminum eutectic and then sequentially depositing a second layer of aluminum atop said alloy and a layer of nickel atop the surface of said second aluminum layer; and then depositing a layer of silver atop the surface of said nickel layer and then sintering said second layer of aluminum and said layers of nickel and silver in a forming atmosphere to sinter said second aluminum layer and said alloy; and thereafter forming an aluminum contact on the top surface of said wafer.

15. The process of claim 14 in which said alloying operation takes place in a forming gas.

16. The process of claim 13 wherein said first layer of pure aluminum has a thickness of about 1000 Å.

17. The process of claim 14 wherein said nickel has a thickness of about 3000 Å.

18. The process of claim 16 wherein said nickel has a thickness of about 3000 Å.

19. The process for the manufacture of a MOS-gated semiconductor device having a first electrode on the top surface of a silicon wafer and a second electrode on the bottom surface of said silicon wafer; said bottom surface of said wafer being of the P type conductivity; said process comprising the steps of forming P-N junctions into said top surface of said wafer, and thereafter forming a trimetal electrode on the bottom surface of said silicon wafer; said process for forming said trimetal electrode comprising the steps of depositing a first layer of pure aluminum on said bottom surface of said silicon wafer, and thereafter alloying together said pure first layer of aluminum and said silicon wafer at a temperature between the melting point of pure aluminum and the melting point of the silicon/aluminum eutectic and then sequentially depositing a second layer of aluminum atop said alloy and a layer of nickel atop the surface of said second aluminum layer; and then depositing a layer of silver atop the surface of said nickel layer; and then sintering said second layer of aluminum and said layers of nickel and silver in a forming atmosphere to sinter said second aluminum layer and said alloy; and thereafter forming an aluminum contact on said top surface of said wafer.

* * * * *